Sept. 5, 1950

A. L. W. WILLIAMS 2,521,661

ELECTRO TRANSDUCER ELEMENT

Filed Oct. 11, 1947

INVENTOR.
ALFRED L. W. WILLIAMS
BY
Elias J. Hyde
ATTORNEY

Patented Sept. 5, 1950 2,521,661

UNITED STATES PATENT OFFICE 2,521,661

ELECTROTRANSDUCER ELEMENT

Alfred L. W. Williams, Cleveland Heights, Ohio, assignor to The Brush Development Company, Cleveland, Ohio, a corporation of Ohio Application October 11, 1947, Serial No. 779,268

1 Claim. (Cl. 171—327)

Figure 1:
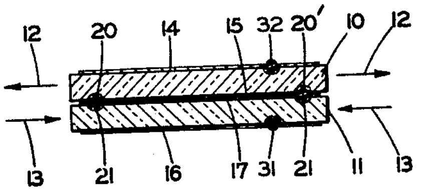

This invention pertains broadly to a new and novel electro-transducer element and more particularly to a piezoelectric crystal element.

Prior art piezoelectric crystal elements comprising one or more plates of crystalline material with electrodes such as foil, graphite or evaporated metal on major faces have utilized leads formed of thin ribbon-like electrically conductive material. When piezoelectric elements utilizing such ribbon-like leads were moistureproofed by dipping them in moistureproofing material, it was found difficult to assure a good, uniform, moisture-tight seal between the moistureproofing material and the lead. This was due probably to the extreme thinness of the lead and the tendency of the moistureproofing material, when liquid, to pull away from sharp edges and corners.

Another disadvantage of a foil-like lead was encountered when a number of plates of crystalline material were connected together in a stack with leads extending out from between the plates at one end of the composite element. The foil-like lead caused the composite element to be appreciably thicker at the lead end than at the other end, with consequent non-parallelism of the several crystal plates.

It is an object of the invention to provide a piezoelectric transducer device which does not exhibit one or more of the disadvantages of the prior art transducer devices.

Another object of the invention is to provide a piezoelectric crystalline element whose lead is comparatively thick and rugged.

It is also an object of the invention to provide a new and novel method of fabricating piezoelectric crystalline elements.

A further object of the invention is to provide a piezoelectric crystal element having one or more leads and which is effectively moistureproofed.

Yet another object of the invention is to provide a multi-plate piezoelectric crystal element whose plates are substantially parallel.

Still another object of the invention is to provide a new and novel method of fabricating an electrotransducer.

In accordance with a feature of the invention, an electro-transducer element comprises a body of electro-transducing material with electrode means on at least one surface portion of the body, and a lead comprising a conduction is fused into the body in electrical contact with the electrode.

In accordance with another feature of the invention the method of fabricating an electro-transducer comprises electroding at least one surface of a body of electro-transducing material, heating a conductor to a temperature above the softening temperature of the material, and pressing the heated conductor against the electroded face of the body. The material in the immediate vicinity of the heated lead softens and the conductor is embedded into the material. Thereafter the conductor and the softened material are cooled.

United States Letters Patent No. 2,479,929, issued August 23, 1949 in the name of Charles K. Gravley and assigned to the same assignee as the present invention, relates to an invention embodying the broad principles of the present invention with the further characterization of a specific manner of constructing the transducer.

For a better understanding of the present invention, together with other and further objects thereof, reference is had to the following description taken in connection with the accompanying drawings, and its scope will be pointed out in the appended claims.

Figure 2:
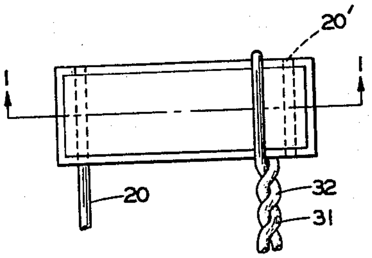
Figure 3:
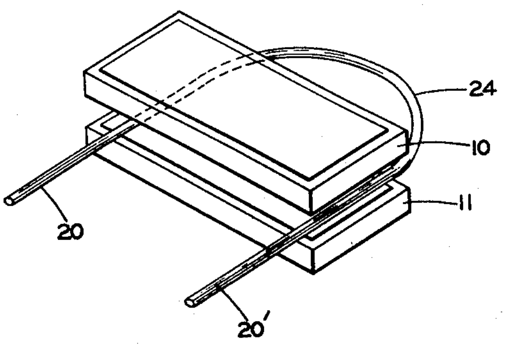
Figures 4, 5:
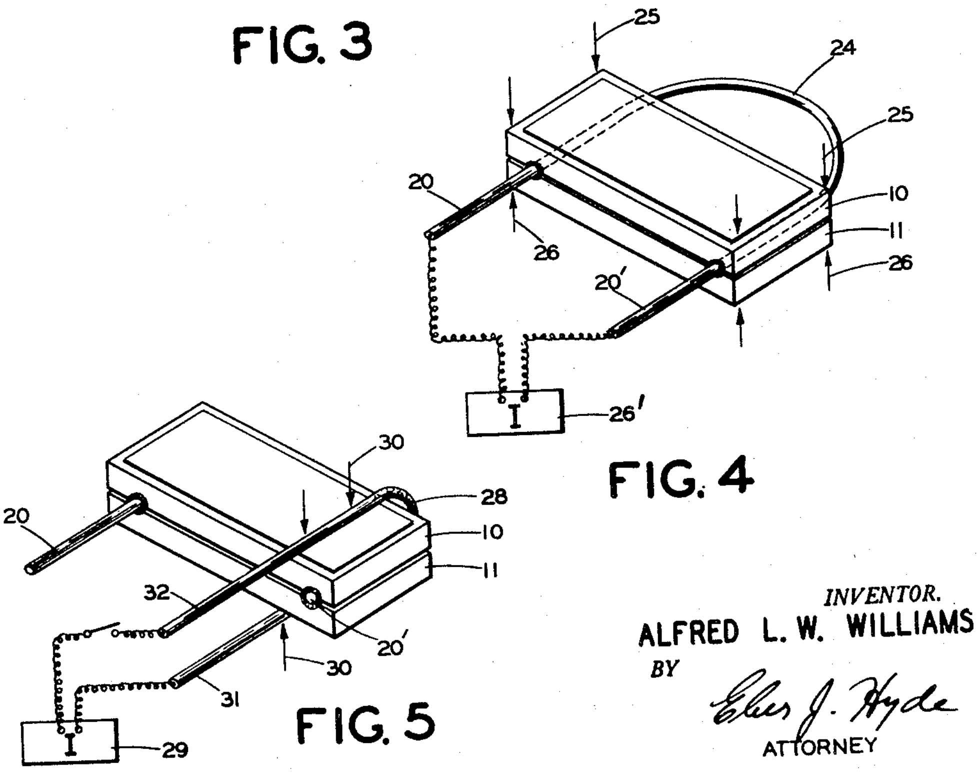

The single sheet of the drawing shows in Fig. 1 a cross-sectional view taken along line 1—1 of Fig. 2 of a multi-plate crystal element embodying the invention; Fig. 2 is a face view of the element shown in Fig. 1; Fig. 3 is an exploded isometric view showing one step in the construction of the element shown in Figs. 1 and 2; Fig. 4 is an isometric view showing another step in the process of constructing the element shown in Figs. 1 and 2; and Fig. 5 shows still a further step in the construction.

Referring to Fig. 1 of the drawing, there is shown an electro-transducer element comprising two plates of fusible piezoelectric crystalline material 10 and 11, such as Rochelle salt, primary ammonium phosphate, or the like, connected together to form a multi-plate flexing element of the general type disclosed in the United States Letter Patent Re. 20,680, granted to Charles B. Sawyer on March 29, 1938 and assigned to the same assignee as the present invention. While the invention is herein illustrated as applied to a flexing type of crystal element, it is to be understood that it is equally applicable to other types of electro-transducers such as single plate transducers and multi-plate expander transducers.

The element shown in Fig. 1 is known as a "bender multi-plate crystal unit" because the plate 10, upon being subjected to a given electrostatic field, is adapted to expand in the direction of the arrows 12, 12, and the plate 11, upon being subjected to an electrostatic field, is adapted simultaneously to contract in the direction of the arrows 13, 13, thereby causing a bending action of the interconnected plates 10, 11

The piezoelectric plate 10 carries electrodes 14 and 15 on its opposite major faces, and the plate 11 carries electrodes 16 and 17 on its opposite major faces for applying the electrostatic field to the transducer plates 10, 11. As is well known to the art the plates 10, 11 may be connected in parallel or in series, depending upon the requirements which the element must fulfill. In the drawing the two plates 10 and 11 are shown connected in parallel. Their major faces are in juxtaposed face-to-face relationship with the electrode 15 of plate 10 in electrical contact with electrode 17 of plate 11, and with a lead 20 in contact with the inner electrode means 15, 17 and with a lead 32, 31 in contact with the outer electrode means 14, 16.

One or more rods 20, 20′ are positioned between the two transducer plates 10, 11 and are connected thereto by means of fused solidified crystalline material 21 which substantially surrounds each of the rods. Preferably two rods are utilized which extend in a direction parallel to the plane of the plates 10, 11 and perpendicular to the directions 12, 13 of expansion and contraction of the plates. Each of the rods is located near one end of the multi-plate element and each is relatively rigid so that it serves as a dowel pin to prevent the two plates from sliding with respect to each other.

As has been pointed out in detail in United States Letters Patent 2,373,445, granted April 10, 1945 on the application of Hans G. Baerwald and assigned to the same assignee as the present invention, a very efficient multi-plate flexing element may be fabricated by rigidly interconnecting the two plates only at their ends, in the case of a bender, and at only at their corners, in the case of a twister. Slippage between the plates in the region between the points of rigid connection tends to increase the efficiency of the unit. The dowel pins of the present construction are ideally suited for such a construction as they may be tightly bonded to the crystalline material in their immediate vicinity, thus maintaining a portion of each of the plates relatively immovable when the element is used as a transducer, yet permitting efficient multi-plate flexing action.

A convenient way to connect the two plates 10 and 11 together is to fabricate the electroded plates 10 and 11 and thereafter to lay the two rods 20, 20′ across the face of the plate 11 in engagement with the upper electrode 17. Preferably the two rods 20, 20′ comprise a single length of fine wire with the closed loop end 24 of the wire extending beyond the edge faces of the crystal element, as is shown in Fig. 3. The electroded plate 10 is thereafter laid across the wire and, as is shown in Fig. 4, a current source 26′ is connected across the open ends of the loop of wire 24 to cause the wire, by conduction of electric current, to become heated to a temperature above the melting point of the crystalline material. The plate 10 is then pushed downward, as indicated by the arrows 25, 25, toward the plate 11 which is supported from underneath, as indicated by the arrows 26, 26. As the hot wire 20, 20′ melts the material in its immediate vicinity, the wire 20, 20′, due to the squeezing action, is embedded substantially equally into both of the plates 10 and 11 and good electrical contact is made between the wire and the two inner electrodes 15 and 17 of the plates 10 and 11. After plate 10 has been pushed until it is in firm contact with plate 11, heating of the wire 20, 20′ is terminated and the wire and the melted crystalline material are allowed to cool, whereupon the melted crystalline material solidifies and causes the wire to adhere to the crystal plates 10 and 11.

The loop 24 is removed by clipping the wires close to the edge faces of the crystal elements. One of the free ends of the wire, for example 20′, is removed by clipping it close to the crystal element. The other free end 20 of the wire is retained as the lead extension for the inner electrode of the multi-plate crystal element.

As a further step in the production of this crystal element the lead to the outside electrodes 14, 16 may also be fused into the top and bottom surfaces of the plates 10 and 11 in substantially the aforedescribed manner. Fig. 5 illustrates such a step wherein a loop of wire 28 extends around the multi-plate crystal element 10, 11. The loop 28 is heated by electric current from a source 29 and, after it reaches a temperature above the melting point of the crystal material, pressure is applied in the direction of the arrows 30, 30 to cause the wire to come in close mechanical contact with the top and bottom surfaces of the multi-plate element. Due to its temperature, the wire melts the crystalline material in its immediate vicinity and, due to the pressure applied, it becomes embedded in the crystal plates. The heating of the wire 28 is thereafter terminated, and the wire and the melted crystalline material are permitted to cool. The back portion of the loop 28 which extends beyond the edge face of the multi-plate element is then clipped off and the two wires 31, 32 are twisted together to form a common lead for the outer electrodes 14, 16 of the multi-plate element.

In the drawing it has been necessary, in order clearly to show the invention, to exaggerate certain dimensions of the transducer with respect to other dimensions. The invention has been successfully carried out utilizing single plates of crystalline material, which are about .03 inch thick, and utilizing solid wire about .003 inch in diameter. Three strands of .001 inch diameter wire twisted together have also been successfully used.

In the practical mass production of multi-plate units, it has been found desirable to start with crystalline plates which are considerably thicker than the aforementioned .03 inch. After the two plates have been connected together with the dowel pins 20, 20′ in place and prior to fusing the lead 31, 32 into the crystalline material, the outside surfaces of the plates 10, 11 may be milled or abraded until they are considerably thinner. The outside electrodes and leads may then be applied to form a very thin multi-plate element. Thus considerable breakage, due to rapidly fabricating thin fragile crystal plates, is greatly reduced.

A further advantage of the invention lies in the fact that two interconnected plates of crystalline material can be parallel to each other even though a lead of appreciable thickness is positioned between them at one end of the assembly. Such an advantage is most appreciated in an assembly of many expander plates. For example, 16 or 18 plates may be connected together face-to-face with a lead between each two plates extending out from one end of the assembly. The lead usually extends between the plates for only such a distance as to enable it to make good electrical contact with an electrode therebetween. This causes the plates in the assembly to be non-parallel. By fusing the wire leads into the crystalline material the non-parallelism of the plates can be obviated.

While there have been described what are at present considered to be the preferred embodiments of this invention, it will be obvious to those skilled in the art that various changes and modifications may be made therein without departing from the invention, and it is, therefore, aimed in the appended claim to cover all such changes and modifications as fall within the true spirit and scope of the invention.

I claim:

An electro-transducer element comprising, in combination, a plate of piezoelectric crystalline material, an electrode secured to a face of said plate, a round wire lead connected to said plate in engagement with said electrode and extending away therefrom, and a moisture-resistant coating of hardended liquid material completely around and adhered to said plate and completely around and adhered to a length of said round wire lead near said plate.

ALFRED L. W. WILLIAMS.

REFERENCES CITED

The following references are of record in the file of this patent:

UNITED STATES PATENTS

| Number | Name | Date |
|---|---|---|
| 2,168,943 | Pfundt | Aug. 8, 1939 |
| 2,382,242 | Arndt | Nov. 6, 1945 |
| 2,393,429 | Swinehart | Jan. 22, 1946 |
| 2,423,922 | Arndt, Jr. | July 15, 1947 |